United States Patent [19]

Chakradhar et al.

[11] Patent Number: 5,506,852

[45] Date of Patent: Apr. 9, 1996

[54] TESTING VLSI CIRCUITS FOR DEFECTS

[75] Inventors: Srimat T. Chakradhar, No. Brunswick; Igor Rivin, Princeton, both of N.J.

[73] Assignee: NEC USA, Inc., Princeton, N.J.

[21] Appl. No.: 210,122

[22] Filed: Mar. 17, 1994

[51] Int. Cl.⁶ .................................................. G01R 31/317
[52] U.S. Cl. ............................ 371/27; 364/489; 364/490; 371/22.2
[58] Field of Search ................................... 371/23, 27, 24, 371/20.4; 364/489, 490; 324/763, 765

[56] References Cited

U.S. PATENT DOCUMENTS

| | | | |
|---|---|---|---|
| 4,862,399 | 8/1989 | Freeman | 371/27 |
| 4,996,689 | 2/1991 | Samad | 371/27 |
| 5,001,418 | 3/1991 | Posse et al. | 371/27 |
| 5,377,197 | 12/1994 | Patel et al. | 371/23 |

OTHER PUBLICATIONS

S. T. Chakradhar et al, "Test Generation Using Neural Computers", International Journal of Computer Aided VLSI Design, vol. 3, Mar. 1991, pp. 241–257.
Kazumi Hatayama et al, "Sequential Test Generation Based on Real–Valued Logic Simulation", Proceedings of the International Test Conference 1992, pp. 41–48.
Kwang–Ting Cheng et al "Unified Methods for VLSI Simulation and Test Generation," by Kluwer Academic Publishers, 1989, Chapter 6, pp. 67–86.

*Primary Examiner*—Ellis B. Ramirez
*Assistant Examiner*—Thomas Peeso
*Attorney, Agent, or Firm*—Philip J. Feig

[57] ABSTRACT

A method based on continuous optimization techniques for generating test vectors for use in testing VLSI circuits includes representing digital circuits as smooth functions. The test generation problem is formulated as the minimization of the objective function over a hypercube in Euclidean space. The dimension of the space is equal to the number of primary inputs of the circuit. The smooth function is optimized inside a convex polytope using a variant of gradient descent and line search strategies. The solution starts at the center of the hypercube and follows a trajectory to one of the corners of the hypercube that corresponds to a test vector. Once the test vector is determined by this method, electrical signals corresponding to the test vector are applied to the inputs of the VLSI circuits. The outputs of the VLSI circuit are monitored in order to locate defects in the circuit. The representation of the logic gates as a continuous family of functions enables the method to quickly find an optimal solution to the test generation problem.

6 Claims, 1 Drawing Sheet

TESTING VLSI CIRCUITS FOR DEFECTS

FIELD OF THE INVENTION

The present invention relates to testing VLSI circuits for defects produced during circuit fabrication. Specifically, the invention formulates the test generation problem as the optimization of a smooth non-linear function defined on a hypercube in Euclidean space, where the dimension of the space is equal to the number of circuit inputs. The solution of the problem yields a test vector which is then applied to the inputs of the VLSI circuit in order to test the VLSI circuit for defects or faults by monitoring the circuit outputs. The solution of the problem involves the use of a family of functions to represent standard logic gates.

BACKGROUND OF THE INVENTION

After VLSI circuits are fabricated on a chip it is necessary to test the circuit for defects or faults. An initial step in the test process is the determination of a test vector which when converted to electrical signals is applied to the inputs of the circuit in order to cause predetermined signals to be manifest as circuit outputs. By monitoring these output signals it is possible to locate defects and/or faults in the VLSI circuit.

Test generation is a process of generating input stimuli, known as test vectors, to a VLSI circuit in order to test for possible defects in the circuit chip by producing observable faulty responses at the chip outputs.

Since the test generation problem is NP-complete, currently used methods are, of necessity, based on heuristic search methods. The majority of these methods are based on combinatorial search techniques that utilize circuit-specific knowledge to systematically explore the search space for a test vector. In each of these methods, signals in the circuit assume only discrete binary values.

An article by S. T. Chakradhar, V. D. Agrawal and M. L. Bushnell entitled "On Test Generation Using Neural Computers" in the International Journal of Computer Aided VLSI Design, Vol. 3, March 1991, pages 241–257 describes a test generation technique based on analog neural networks which generates test vectors by allowing signals to assume any real value between 0 and 1. However, since large scale neural networks are not presently available, only small circuit can be processed by this technique.

A simulation based cost function approach to using non-binary values for signals has been proposed in the book by K. T. Cheng and V. D. Agrawal entitled "Unified Methods for VLSI Simulation and Test Generation" by Kluwer Academic Publishers, 1989 and in an article by K. Hatayama et al entitled "Sequential Test Generation Based on Real-Valued Logic Simulation" in the Proceedings of the International Test Conference 1992, pp. 41–48.

SUMMARY OF THE INVENTION

The present invention is based on a continuous optimization approach for the test generation of combinational circuits and includes representing digital circuits as smooth functions. The domain of the signal values is extended from the traditional Boolean 0 or 1 value to the real unit interval [0,1]. In addition, the Boolean gate responses are extended to handle real input values. Non-linear smooth functions are constructed for each gate. A non-linear continuous function for the entire circuit is obtained as a summation of the individual gate functions. A similar function is derived for the faulty circuit. An objective function is constructed using both the non-faulty and the faulty circuits. The objective function is minimized when at least one of the corresponding outputs of the non-faulty and faulty circuits differ.

The test generation problem is formulated as the optimization of a smooth non-linear function defined on a hypercube in Euclidian space. The dimension of the space is equal to the number of circuit primary inputs. The smooth function is optimized inside a convex polytope using a variant of gradient descent and line search strategies. The solution starts in the center of the real hypercube and follows a trajectory through the center of the hypercube to one of the corners (vertices) of the hypercube that corresponds to a test vector. The optimal value of the objection function is guaranteed to be achieved at one or more of the hypercube vertices. This method is based on numerical analysis techniques that can easily be converted to a parallel test generation method.

The present invention therefore, provides a novel method for discrete test generation by a continuous optimization method. The invention also provides novel representation of logic gates in the form of unique equations and the representation of the circuit output in terms of the gates themselves. As a result of applying the disclosed method, a test vector is generated which is applied to a VLSI circuit in order to then test the circuit for defects.

Another aspect of the present invention is the parametrized family of functions used in the representation of the various standard logic gates such as AND, OR, NAND, NOR, NOT, XOR, and XNOR. The use of the unique family of functions enables the method of determining the test vector to find an optimal solution to the test generation problem.

The present invention will be more clearly understood when the following description is read in conjunction with the accompanying drawings.

DETAILED DESCRIPTION

Figure 1:
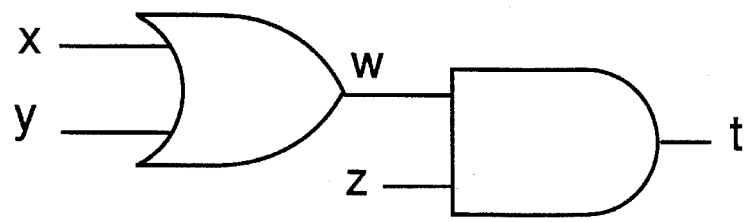
FIG. 1 is a schematic diagram of a circuit for use as a test generation example.

In order to understand the test generation problem, consider a combinational circuit to be a collection of gates that implement standard logic functions such as AND, OR, NAND, NOR, NOT, XOR, or XNOR. In the test generation problem, begin with two identical circuits $C_1$ and $C_2$ that share the same primary inputs, except that one of the wires (or signals) w of $C_2$ is modified so that it always assumes the same Boolean value s. The wire w assumes this Boolean value irrespective of the primary input signal values. The goal is to determine a set of Boolean values for the primary inputs of $C_1$ or $C_2$ so that the output responses of $C_1$ and $C_2$ differ. If s=0, there is a stuck-at-0 (s-a-0) fault at w. If s=1, there is a stuck-at-1 (s-a-1) fault at w. Since the output responses must differ, if every output signal of $C_1$ is XORed with the corresponding signal of $C_2$, and the resulting signals are ORed together, then the output of the final OR gate must assume a value 1.

The basic strategy of the present invention is to convert a combinatorial problem into a smooth optimization problem. For simplicity, assume that a circuit C has a single output. The multiple output case can be handled in a similar way. The circuit C can be viewed as a discrete function $f_c$: $\{0,1\}^{I_c} \rightarrow \{0,1\}$ that maps vertices of a unit hypercube onto the Boolean values 0 or 1. Here, $I_c$ is the number of primary inputs of circuit C. The function $f_c$ is extended to a continuous function $\tilde{f}_c$: $[0,1]^{I_c} \rightarrow [0,1]$ that maps points on the surface or the, interior of the real unit hypercube onto the real interval [0,1]. There are many ways to extend $f_c$. However, from an optimization point of view, it is desirable that the extension $\tilde{f}_c$ should have the following properties:

(1) $\tilde{f}_c$ agrees with $f_c$ on $\{0,1\}$. In other words, both functions evaluate to the same value for any vertex of the Boolean hypercube.

(2) $\tilde{f}_c$ is very smooth on $[0,1]^{I_c}$. If this property is satisfied, then smooth optimization techniques can be used to obtain a global minimum of $\tilde{f}_c$.

(3) $\tilde{f}_c$ has few local extrema in the interior of the real unit hypercube $[0,1]^{I_c}$.

It is impractical to analyze the entire circuit C to find the "best" extension function $\tilde{f}_c$. Therefore, the discrete function of each basic gate is extended to a continuous function and suitably combined with the gate continuous functions in order to obtain a continuous function for the entire circuit. Continuous functions for the basic gates satisfy the properties mentioned above. For the sake of simplicity, it is assumed that the circuit comprises only one or two input gates. If the circuit has gates with more than two inputs, they can be replaced by an equivalent combination of one or two-input gates. Given the objective of the invention, the preferred manner of extending the function for a gate is to use linear or bilinear interpolation. This results in the following extensions of the discrete gate functions:

$$\widetilde{NOT}(x) = 1-x$$

$$\widetilde{AND}(x,y) = xy$$

$$\widetilde{NAND}(x,y) = 1-xy$$

$$\widetilde{OR}(x,y) = x+y-xy$$

$$\widetilde{XOR}(x,y) = x+y-2xy$$

$$\widetilde{NOR}(x,y) = 1-x-y+xy$$

As an example, consider the discrete function $OR(x,y) = x \vee y$. The continuous function $\widetilde{OR}(x, y)$ assumes the same value as the discrete counterpart for any set of Boolean values for x and y. For example, if $x=0$ and $y=1$, both functions evaluate to 1. Also, it can be shown that the continuous function $\widetilde{OR}(x,y)$ is non-negative and it has no local extrema. Continuous functions for other basic gates also satisfy similar properties.

Note that bilinear interpolations can be viewed as special cases of the following parametrized family of functions:

$$\widetilde{NOT}^*(x) = (1-x)^{\alpha_1}$$

$$\widetilde{AND}^*(x,y) = x^{\alpha_2} y^{\beta_2}$$

$$\widetilde{NAND}^*(x,y) = 1 - x^{\alpha_3} y^{\beta_3}$$

$$\widetilde{OR}^*(x,y) = x^{\alpha_4} + y^{\beta_4}(1-x)^{\gamma_4}$$

$$\widetilde{XOR}^*(x,y) = x^{\alpha_5}(1-y)^{\beta_5} + y^{\gamma_5}(1-x)^{\delta_5}$$

$$\widetilde{NOR}^*(x,y) = 1 - (x^{\alpha_6} + y^{\beta_6}(1-x)^{\gamma_6})$$

The exponents can be any positive real numbers. The subscripts on the exponents are used to indicate that they need not be the same on different gates. In fact, they could be different for different instances of the same gate type. This flexibility is used to improve the performance of the test generator.

Consider a circuit $C_1$ with a target fault on line w. Construct a circuit $C_2$ that is identical to the circuit $C_1$. The circuits $C_1$ and $C_2$ share the same primary input signals and the corresponding primary outputs are connected using XOR and OR gates. Also, line w in circuit $C_2$ assumes the faulty value. Let C be the circuit comprising $C_1$, $C_2$ and the additional XOR and OR gates. The circuit C has a single primary output that is also the output of the final OR gate. Any set of primary input values for circuit C that produce a Boolean value 1 at the primary output of C is a test for the given fault.

The natural objective function to optimize is simply the primary output value $\tilde{f}_c$ of circuit C. Since the desired output value is 1, it is desirable to minimize the function $1-\tilde{f}_c$. However, the natural choice of objective function may not necessarily be the best. Consider an AND gate with inputs x and y. It is easy to see that $\widetilde{AND}(x,0)=0$, for any value of x. However, since discrete values of x are desired, a "forcing term" $g_c = \Sigma_{x \in I_c} x(1-x)$ is added to the objective function. The forcing term $g_c \geq 0$. Furthermore, $g_c = 0$ if and only if all the primary inputs assume the discrete value 0 or 1. Therefore, the forcing term biases the optimization towards discrete solutions. Thus, the objective function to be minimized is $F_c = 1 - \tilde{f}_c + \lambda g_c$. The parameter $\lambda$ can be picked to bias the optimization towards discrete solutions or towards minimizing $1-\tilde{f}_c$. In our experiments, $\lambda$ was set to 1. If there exists a test for the fault, the objective function assumes an optimum value of 0.

If the fault is on a primary output of a circuit S, it is necessary to construct two identical copies. For example, if the target fault is a s-a-0 on the primary output of circuit S, then any set of primary input values for which the circuit assumes a value 1 is a test for the fault. Therefore, the desired output value is $f_s = 1$ and the objective function to be minimized is $F_s = 1 - \tilde{f}_s + \lambda g_s$. Similarly, if the target fault is a s-a-1 then the desired primary output value is 0 and the objective function is $F_s = \tilde{f}_s + \lambda g_s$.

Methods available for optimizing smooth objective functions inside convex polytopes range from classical numerical analysis techniques to simulated annealing and genetic algorithms. The present invention uses the classical methods, both out of an intuition that these methods were more suitable to the problem at hand, and out of a desire for "conceptual purity". Simulated annealing and genetic algorithms may produce excellent results, but they require extensive parameter-twiddling stemming from a deep analysis of the objective function.

The present invention uses a variation of the pure gradient descent method to minimize $F_c$. Let $x, \ldots, x_{I_c}$ be the primary inputs of circuit C. Initially, all primary inputs are set to the "neutral" value of 0.5. This corresponds to picking an initial state that is close to the center of the real unit hypercube of dimension $I_c$. Then a trajectory is followed through the interior of the hypercube to reach one of its vertices that correspond to the optimal solution. At every iteration, approximate $\partial F_c / \partial x_k$, $0 < k < I_c$, by the difference quotient $\Delta_k F_c / \Delta x_k$. Here, $\Delta_k F_c = F_c(x_1, \ldots x_k + \Delta x_k, \ldots x_{I_c}) - F_c(x_1, \ldots$ ..., $x_k$, ..., $x_{i_c}$). Line search strategies based on the method of bisection are used to decide how far one should move along the gradient direction.

During the gradient descent optimization, one of the following events may occur:

1. The value of $F_c$ is very close to the known optimum value.
2. The value of $F_c$ is not quite close to the optimum, but the value of the monitored output $f_c$ is close to the desired value.
3. The norm of the approximation to the gradient is very small. This indicates that the point is close to either a global or a local optimum of $F_c$.
4. One of the primary inputs $x_k$ of circuit C is very close to 1 or 0.

If events 1, 2 or 3 occur, the values of all primary inputs are rounded to the closest discrete values and $F_c$ is evaluated. If $F_c$ assumes the optimum value for the discrete primary input vector, the result is a test. Otherwise, the method exits with a failure indicating that the method was unable to obtain a global minimum of $F_c$. If event 4 occurs, $x_k$ is rounded to the appropriate discrete value. This reduces the effective dimension of the optimization problem by one and the optimization process continues. A good heuristic is to check whether rounding the primary inputs will result in $F_c$ assuming its optimum value.

The preferred implementation attempts to generate a test for the fault by considering every reachable primary output f. The combinational logic circuit that determines the value of f is identified. Let $I_c$ be the set of primary inputs of this logic circuit. Note that the cardinality of set $I_c$ may be smaller than the total number of primary inputs of the circuit. An attempt is made to obtain a test vector that detects the fault on output f. If the attempt fails to obtain a test, each reachable primary output is considered in turn. The following steps are performed for a given fault and a given output f:

1. Initialize all primary inputs in $I_c$ to 0.5. This corresponds to starting the descent from the center of the real hypercube of dimension $I_c$. (Other initial values, while possible, have proven to be less effective in practice.)
2. Compute the approximate gradient $\Delta_k F_c/\Delta x_k$. This is done by simulating C with its gates replaced by their corresponding bilinear models described above.
3. Search for a local optimum in the gradient direction. If the local optimum has one of the primary input values close to 0 or 1, clamp the primary input to the discrete value.
4. Check if events 1, 2 or 3 above occur. If they do not occur, then go to Step 2.
5. Round the inputs to the nearest discrete values. If these values correspond to a test, stop. Otherwise, continue with the next reachable primary output.

Referring now to the circuit shown in FIG. 1. The circuit has three inputs x, y, and z, and one output t.

Using the simple extensions of discrete gate functions described above, the following equations are derived:

$$\tilde{w} = \tilde{x} + \tilde{y} - \widetilde{xy}$$

$$\tilde{t} = \widetilde{wz}$$

The dependence of the continuous output $\tilde{t}$ on the continuous inputs $\tilde{x}, \tilde{y}, \tilde{z}$ can be expressed as follows:

$$\tilde{t} = (\tilde{x} + \tilde{y} - \widetilde{xy})\tilde{z}$$

The gradient of $\tilde{t}$ is computed using the following partial derivatives:

$$\frac{\partial \tilde{t}}{\partial \tilde{x}} = \tilde{z} - \widetilde{zy}, \quad (1)$$

$$\frac{\partial \tilde{t}}{\partial \tilde{y}} = \tilde{z} - \widetilde{zx}, \quad (2)$$

$$\frac{\partial \tilde{t}}{\partial \tilde{z}} = \tilde{x} + \tilde{y} - \widetilde{xy}. \quad (3)$$

Consider the problem of generating a test to detect a stuck-at-0 fault on the output t. Any set of values for x, y, and z that force signal t to assume the value 1 is a test. The starting point for the continuous descent method is $\tilde{x}=0.5$, $\tilde{y}=0.5$, $\tilde{z}=0.5$. Using equations 1, 2 and 3, the gradient of $\tilde{t}$ at the starting point is computed to be (0.25, 0.25, 0.75). If the step-size is equal to 1, the updated values of $\tilde{x}, \tilde{y}$, and $\tilde{z}$ will be 0.75, 0.75, and 1.0 respectively. Rounding these to the nearest integer value, we get x=1, y=1, z=1. A simulation reveals that these values do indeed force the value of t to be 1. Therefore, x=y=z=1 is a test vector for the stuck-at-0 fault on the output t.

In the preferred implementation, the primary output continuous function is not explicitly computed in terms of the primary inputs. The gradient of the primary output continuous function is derived directly from the individual gate functions.

Figure 2:
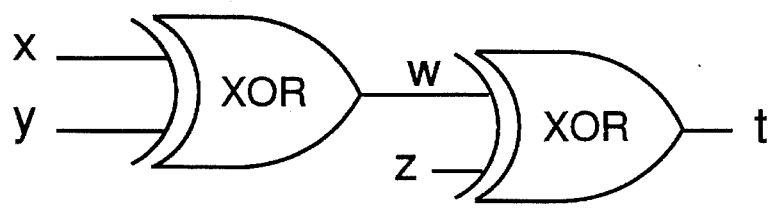
FIG. 2 is a schematic diagram of a circuit for illustrating the use of exponents.

To see the usefulness of generalized exponents, reference is made to the circuit shown in FIG. 2. This circuit also has three inputs and one output. A test is generated to detect a stuck-at-0 fault on the output t. Using the simple continuous extensions of the boolean functions given above results in:

$$\tilde{w} = \tilde{x} + \tilde{y} - 2\widetilde{xy}$$

$$\tilde{t} = \tilde{w} + \tilde{z} - 2\widetilde{wz}$$

By substituting for $\tilde{w}$, we can express the continuous function $\tilde{t}$ as the following function of the primary inputs:

$$\tilde{t} = \tilde{x} + \tilde{y} + \tilde{z} - 2\widetilde{xy} - 2\widetilde{xz} - 2\widetilde{yz} + 4\widetilde{xyz} \quad (4)$$

Again, the partial derivatives are computed to be:

$$\frac{\partial \tilde{t}}{\partial \tilde{x}} = 1 - 2\tilde{y} - 2\tilde{z} + 4\widetilde{yz}, \quad (5)$$

$$\frac{\partial \tilde{t}}{\partial \tilde{y}} = 1 - 2\tilde{x} - 2\tilde{z} + 4\widetilde{xz}, \quad (6)$$

$$\frac{\partial \tilde{t}}{\partial \tilde{z}} = 1 - 2\tilde{x} - 2\tilde{y} + 4\widetilde{xy}. \quad (7)$$

If the same starting point (0.5, 0.5, 0.5) is used, it is seen that the gradient will be the zero vector. Therefore, the starting point result is being held in a local minima.

Instead, if the function $f(x,y)=x+y^2-2xy^2$ is used as the continuous extension of XOR, the following equations result for $\tilde{x}$ and $\tilde{t}$:

$$\tilde{w} = \tilde{x} + \tilde{y}^2 - 2\widetilde{xy}^2$$

$$\tilde{t} = \tilde{w} + \tilde{z}^2 - 2\widetilde{wz}^2$$

Substituting for $\tilde{w}$ in the equation for $\tilde{t}$, results in the following function for $\tilde{t}$:

$$\tilde{t} = \tilde{x} + \tilde{y}^2 - 2\widetilde{xy}^2 + \tilde{z}^2 - 2\widetilde{xz}^2 - 2\widetilde{y}^2\tilde{z}^2 + 4\widetilde{xy}^2\tilde{z}^2 \quad (8)$$

The partial derivatives of $\tilde{t}$ are as follows:

$$\frac{\partial \tilde{t}}{\partial x} = 1 - 2\tilde{y}^2 - 2\tilde{z}^2 + 4\tilde{y}^2\tilde{z}^2, \quad (9)$$

$$\frac{\partial \tilde{t}}{\partial y} = 2\tilde{y} - 4\tilde{x}\tilde{y} - 4\tilde{y}\tilde{z}^2 + 8\tilde{x}\tilde{y}\tilde{z}^2, \quad (10)$$

$$\frac{\partial \tilde{t}}{\partial z} = 2\tilde{z} - 4\tilde{x}\tilde{z} - 4\tilde{y}^2\tilde{z} + 8\tilde{x}\tilde{y}^2\tilde{z}. \quad (11)$$

At the center-point (0.5, 0.5, 0.5), the gradient is (0.25, 0.0, 0.0). If the step-size is 1, the next point will be (0.75,0.5,0.5). The values of $\tilde{y}$ and $\tilde{z}$ are still neutral, so another step needs to be taken. The new gradient is computed to be (0.25,−0.25,−0.25), and the new point is (1,0.25, 0.25). If the numbers are rounded, the result is the test vector (1,0,0).

Figure 3:
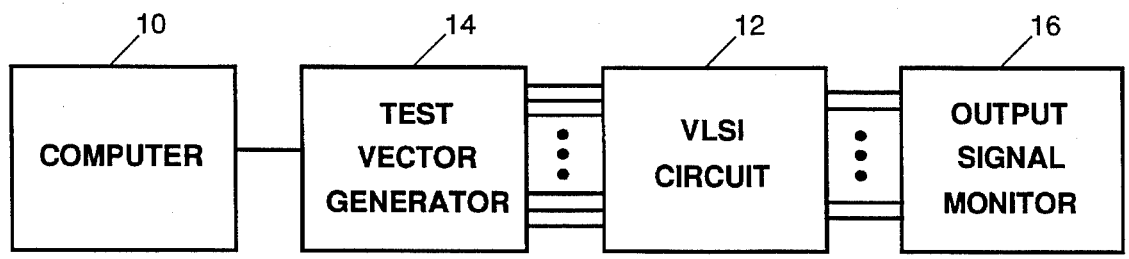
FIG. 3 is a schematic diagram of the testing of a VLSI circuit.

After applying the present method of test generation to determine a test vector, the test vector is applied to the corresponding inputs of the VLSI circuit to be tested whereupon the outputs from the circuit are monitored in order to check for any defect or fault in the VLSI circuit. Thus, the invention concerns a method of test generation to determine a test vector which is then applied to the VLSI circuit to be checked for defects or faults and the outputs of the circuit are monitored to locate such defects or faults. That is, the invention is a method of testing a VLSI circuit for defects or faults as shown with reference to FIG. 3.

The above described method of determining a test vector is performed by a computer 10. After a test vector having a series of values associated with each primary input of the VLSI circuit to be tested 12 is determined, the test vector is "converted" into electrical signals by a test vector generator 14. The outputs from test vector generator 14 are applied to the respective primary inputs of the VLSI circuit 12. An output signal monitor 16 is connected for monitoring the outputs of the VLSI circuit responsive to the signals applied to the primary inputs from the test vector generator. The monitor 16 provides an output signal indicative of the presence or absence of any defect on fault in the VLSI circuit. When the monitored signals indicate the absence of any defects or faults, the circuit is passed along for further processing into a finished product. If a defect or fault is detected, the circuit may be further inspected in order to determine the nature or cause of the defect, or the circuit may be repaired or scrapped.

A limitation of the current method is its handling of redundancies in the circuit. Consider, for example simple circuit C given by the formula y=x∧x̄. Obviously, it is impossible to detect a stuck-at-0 fault at the output y of C. However, the present method will first represent C as the function $\tilde{y}=\tilde{x}*(1-\tilde{x})$, which achieves a maximum at the point $\tilde{x}=0.5$. That maximum is purely an artifact of the method of extension from the discrete to the continuous. Hence, redundant faults will both take a long time to fail on (since the optimization will seem to converge), and are very difficult to prove redundant in general.

Another limitation arises when an $\widetilde{AND}$ gate with 1000 inputs is considered. Its discrete model is as follows:

$$y = \bigwedge_{i=1}^{1000} x, \quad (12)$$

The corresponding continuous function will $\tilde{y}=\tilde{x}^{1000}$. At the point $\tilde{x}=0.5$, $\tilde{y}=0.0$ within the limits of machine precision (using IEEE double-precision floating point numbers), and indeed, for $\tilde{x}<1-\epsilon$ the function $\tilde{y}$ is essentially identically 0.0. This naturally causes great difficulty to any descent method. Fortunately, such circuits are unlikely to appear in practice.

Also, consider again the $\widetilde{AND}$ gate with 1000 inputs. Even if the computation was exact (for example, exact rational arithmetic could be used in place of IEEE double-precision floating point arithmetic), there would still be a problem of determining the correct stopping point. For example, if $\tilde{x}$=99/100, then $\tilde{y}\approx$exp(−10). However, rounding $\tilde{x}$ to the nearest integer 1 will produce y=1. While for this simple example there are ways to get around the problem, there may be cases in which this "pathological" behavior is embedded in the circuit. Neither this situation nor the encountered numerical instability problem have been encountered in any of ISCAS '85 and ISCAS '89 benchmark circuits tested.

The continuous optimization test generation method described above has been prototyped on a Silicon Graphics Indigo workstation. All tests generated by the prototype were verified by fault simulation. Given a target fault, identify all primary outputs that are reachable from the fault site. For each primary output p, identify the primary inputs that have a structural path to p. These are the only primary inputs that can influence a value on p and, therefore, they determine the effective dimension of the optimization problem.

While there has been described and illustrated a preferred method of determining a test vector for testing VLSI circuits, it will be apparent to those skilled in the art that variations and modifications are possible without deviating from the broad principles of the present invention which should be limited solely by the scope of the claims appended hereto.

What is claimed is:

1. A method of testing a VLSI circuit having p primary inputs and t outputs for defects comprising the steps of:

forming a test vector by initializing each primary input to an initial value between 0 and 1;

computing an approximate gradient $\Delta_k F_c/\Delta x_k$ for the primary input values;

determining a local optimum gradient direction and the distance along the gradient for determining new primary input values, and if a local optimum gradient does not result in setting each primary input value within a predetermined range of a discrete value, recompute an approximate gradient for the new primary input values and determine a local optimum gradient direction and distance along the gradient, or if a local optimum gradient is found resulting in each primary input value within a predetermined range of 0 or 1, rounding each respective primary input to the discrete value 0 or 1 to which the primary input value is within the predetermined range as values of the test vector;

forming a test vector from the values for the primary inputs set to the discrete value;

applying the formed test vector to the primary inputs of the VLSI circuit under test; and monitoring the outputs of the circuit to determine the presence or absence of any defect in the VLSI circuit under test.

2. A method of testing a VLSI circuit as set forth in claim 1, where gate functions are defined as:

$\widetilde{NOT}(x)=1-x$ $\widetilde{AND}(x,y)=xy$ $\overline{\text{NAND}}(x,y) = 1-xy$ $\overline{\text{OR}}(x,y) = x+y-xy$ $\overline{\text{XOR}}(x,y) = x+y-2xy$ $\overline{\text{NOR}}(x,y) = 1-x-y+xy$ 3. A method of testing a VLSI circuit as set forth in claim 1, where gate functions are defined as:

$\overline{\text{NOT}}^*(x) = (1-x)^{\alpha_1}$ $\overline{\text{AND}}^*(x,y) = x^{\alpha_2} y^{\beta_2}$ $\overline{\text{NAND}}^*(x,y) = 1 - x^{\alpha_3} y^{\beta_3}$ $\overline{\text{OR}}^*(x,y) = x^{\alpha_4} + y^{\beta_4}(1-x)^{\gamma_4}$ $\overline{\text{XOR}}^*(x,y) = x^{\alpha_5}(1-y)^{\beta_5} + y^{\gamma_5}(1-x)^{\delta_5}$ $\overline{\text{NOR}}^*(x,y) = 1 - (x^{\alpha_6} + y^{\beta_6}(1-x)^{\gamma_6})$ 4. A method of testing a VLSI circuit as set forth in claim 1, where the initial value for each primary input is approximately 0.5.

5. A method of testing a VLSI circuit as set forth in claim 4, where gate functions are defined as:

$\overline{\text{NOT}}(x) = 1-x$ $\overline{\text{AND}}(x,y) = xy$ $\overline{\text{NAND}}(x,y) = 1-xy$ $\overline{\text{OR}}(x,y) = x+y-xy$ $\overline{\text{XOR}}(x,y) = x+y-2xy$ $\overline{\text{NOR}}(x,y) = 1-x-y+xy$ 6. A method of testing a VLSI circuit as set forth in claim 4, where gate functions are defined as:

$\overline{\text{NOT}}^*(x) = (1-x)^{\alpha_1}$ $\overline{\text{AND}}^*(x,y) = x^{\alpha_2} y^{\beta_2}$ $\overline{\text{NAND}}^*(x,y) = 1 - x^{\alpha_3} y^{\beta_3}$ $\overline{\text{OR}}^*(x,y) = x^{\alpha_4} + y^{\beta_4}(1-x)^{\gamma_4}$ $\overline{\text{XOR}}^*(x,y) = x^{\alpha_5}(1-y)^{\beta_5} + y^{\gamma_5}(1-x)^{\delta_5}$ $\overline{\text{NOR}}^*(x,y) = 1 - (x^{\alpha_6} + y^{\beta_6}(1-x)^{\gamma_6})$

\* \* \* \* \*